United States Patent
Mei

(10) Patent No.: US 10,676,625 B2
(45) Date of Patent: Jun. 9, 2020

(54) ZINC OXIDE INK AND METHOD FOR MANUFACTURING THE SAME, ELECTRON TRANSPORT LAYER AND DISPLAY DEVICE

(71) Applicant: BOE TECHNOLOGY GROUP CO., LTD., Beijing (CN)

(72) Inventor: Wenhai Mei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/029,171

(22) Filed: Jul. 6, 2018

(65) Prior Publication Data
US 2019/0112491 A1 Apr. 18, 2019

(30) Foreign Application Priority Data
Oct. 12, 2017 (CN) .......................... 2017 1 0948401

(51) Int. Cl.
C09D 11/037 (2014.01)
C09D 11/52 (2014.01)
(Continued)

(52) U.S. Cl.
CPC .............. *C09D 11/037* (2013.01); *C07F 3/06* (2013.01); *C09D 11/033* (2013.01);
(Continued)

(58) Field of Classification Search
None
See application file for complete search history.

(56) References Cited

U.S. PATENT DOCUMENTS

| | | | |
|---|---|---|---|
| 2005/0004293 A1* | 1/2005 | Peng | C09K 11/02 524/439 |
| 2007/0141114 A1* | 6/2007 | Muisener | C09D 5/1693 424/427 |
| 2010/0197848 A1* | 8/2010 | Verghese | C08L 63/00 524/502 |

FOREIGN PATENT DOCUMENTS

| | | |
|---|---|---|
| CN | 101582383 A | 11/2009 |
| CN | 102844382 A | 12/2012 |

(Continued)

OTHER PUBLICATIONS

First Office Action dated Feb. 3, 2020 corresponding to Chinese application No. 201710948401.3.

*Primary Examiner* — William D Young
(74) *Attorney, Agent, or Firm* — Nath, Goldberg & Meyer; Joshua B. Goldberg

(57) ABSTRACT

The present disclosure provides a zinc oxide ink and a method for manufacturing the same, an electron transport layer and a display device. The zinc oxide ink includes zinc oxide nanoparticles loaded with ligands, wherein the ligand is derived from aliphatic compounds having a carbon chain of three or more carbon atoms and the ligand has a cross-linkable group at a site close to a coordination atom. The zinc oxide ink increases the steric hindrance among the zinc oxide nanoparticles, thereby preventing the aggregation between the zinc oxide nanoparticles, and accordingly and further avoiding the formation of black points in the formed layer. Meanwhile, the ligands have self-crosslinking property and thus form a web-like structure to prevent the formation of pores in the layer due to the rapid volatilization of the solvent, and the quality of the formed layer by using the zinc oxide ink is ensured.

7 Claims, 2 Drawing Sheets

(51) Int. Cl.
  *C09D 11/033* (2014.01)
  *C09D 11/36* (2014.01)
  *H01L 51/00* (2006.01)
  *C07F 3/06* (2006.01)
  *C09D 11/322* (2014.01)
  *C09K 11/08* (2006.01)
  *H01L 51/50* (2006.01)

(52) U.S. Cl.
  CPC ............ *C09D 11/322* (2013.01); *C09D 11/36* (2013.01); *C09D 11/52* (2013.01); *C09K 11/0811* (2013.01); *H01L 51/0092* (2013.01); *H01L 51/502* (2013.01); *H01L 51/5072* (2013.01)

(56) References Cited

FOREIGN PATENT DOCUMENTS

| | | |
|---|---|---|
| CN | 105331182 A | 2/2016 |
| CN | 105378002 A | 3/2016 |
| CN | 102464913 B | 6/2016 |
| CN | 105810851 A | 7/2016 |
| CN | 106349815 A | 1/2017 |
| CN | 106380934 A | 2/2017 |
| CN | 106654026 A | 5/2017 |
| CN | 106752375 A | 5/2017 |

* cited by examiner

ZINC OXIDE INK AND METHOD FOR MANUFACTURING THE SAME, ELECTRON TRANSPORT LAYER AND DISPLAY DEVICE

FIELD

The present disclosure relates to the field of display technology, and in particular, to a zinc oxide ink and a method for manufacturing the same, an electron transport layer and a display device.

BACKGROUND

A quantum dot light emitting device (QLED) has many advantages of high color gamut, self-illumination, low starting voltage, high response speed and the like, and is becoming a very popular research direction at present.

At present, an electron transport layer in a QLED is usually obtained by printing (such as an ink jet printing method or a micro contact printing method) a zinc oxide ink. In the process of forming the electron transport layer by an ink jet printing method, zinc oxide nanoparticles in the zinc oxide ink are likely to aggregate, resulting in black points in the layer. Meanwhile, as the solvent in the zinc oxide ink is volatized very quickly during the layer forming, a large number of pores are likely to occur in the layer formed by printing. Both the black points and the pores seriously affect the quality of the electron transport layer.

Therefore, it is very necessary to develop a novel zinc oxide ink which is more suitable for forming electron transport layer by printing.

SUMMARY

The present disclosure provides a zinc oxide ink and a method for manufacturing the same, an electron transport layer and a display device to overcome the above technical problems in the prior art.

The present disclosure provides a zinc oxide ink, including zinc oxide nanoparticles loaded with ligands, wherein the ligand is derived from aliphatic compounds having a carbon chain of three or more carbon atoms; and the ligand has a cross-linkable group at a site close to a coordination atom.

Optionally, the ligand has a branched functional group at the tail end thereof.

Optionally, the coordination atom of the ligand forms an ion pair structure.

Optionally, the ligand is derived from alcohol amine aliphatic compounds having three to eight carbon atoms.

Optionally, the cross-linkable group includes one or more alkenyls or alkynyls.

Optionally, the zinc oxide ink further comprises a cross-linking agent, and the cross-linking agent includes a dimercapto compound.

Optionally, the zinc oxide ink further comprises a volatile solvent and a non-volatile solvent.

The present disclosure further provides an electron transport layer that is made from the above zinc oxide ink.

The present disclosure further provides a display device, including the above electron transport layer.

The present disclosure further provides a method for manufacturing the above zinc oxide ink, including:
preparing an ethanol solution of zinc oxide nanoparticles;
adding a ligand compound into the ethanol solution of the zinc oxide nanoparticles, stirring the solution and adding ethyl acetate therein to precipitate zinc oxide nanoparticles, wherein the zinc oxide nanoparticles are loaded with ligands derived from the ligand compound, and the ligand compound is selected from aliphatic compounds having a carbon chain of three or more carbon atoms; and the ligand compound has a cross-linkable group at a site close to a coordination atom; and
dissolving the zinc oxide nanoparticles loaded with the ligands in a mixed solvent comprising a volatile solvent and a non-volatile solvent, and adding an initiator and a cross-linking agent therein to form the zinc oxide ink.

DETAILED DESCRIPTION OF THE EMBODIMENTS

In order that those skilled in the art can better understand the technical solutions of the present disclosure, zinc oxide ink and a method for manufacturing the same, an electron transport layer and a display device provided by the present disclosure will be further detailed below in conjunction with the drawings and specific embodiments.

Figure 1:
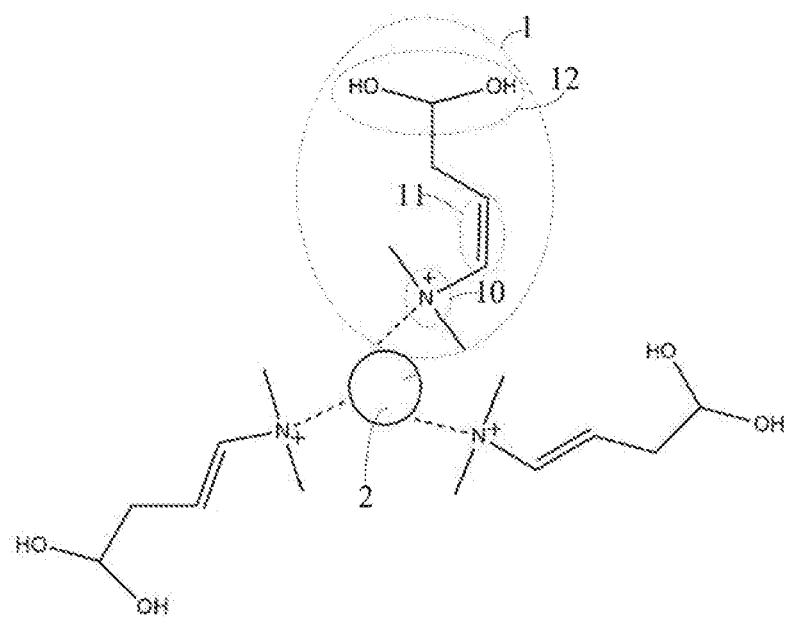
FIG. 1 is a schematic diagram showing the structure of the zinc oxide nanoparticles loaded with ligands according to an embodiment according to the present disclosure.

An embodiment of the present disclosure provides a zinc oxide ink, as shown in FIG. 1, including zinc oxide nanoparticles 2 loaded with ligands 1, wherein the ligand 1 is derived from an aliphatic compounds having a carbon chain of three or more carbon atoms; and the ligand 1 has a cross-linkable group 11 at a site close to a coordination atom 10.

The ligand 1 can be derived from alcohol amine aliphatic compounds, carboxylic acid amino aliphatic compounds, aldehyde amino aliphatic compounds, carbonyl amino aliphatic compounds, ester amino fatty compounds or halogen amino aliphatic compounds.

The ligand 1 is preferably derived from an alcohol amine having a C3 to C8 aliphatic chain, such as 1-alkenyl-5,5'-dihydroxypentylamine.

Compared with the zinc oxide nanoparticles in which the ligand is derived from ethanolamine (that is, the ligand has a chain length of only two carbon atoms) in the prior art, the zinc oxide nanoparticles 2 of the present disclosure have the ligand 1 which has a chain length of three or more carbon atoms, this increases the steric hindrance among the zinc oxide nanoparticles 2, thereby avoiding the aggregation among the zinc oxide nanoparticles 2 and further avoiding the formation of black points in the layer formed by the zinc oxide ink.

Figure 3:
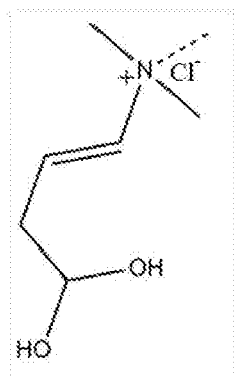
FIG. 3 is a structural of a ligand according to an embodiment of the present disclosure.
Figure 4:
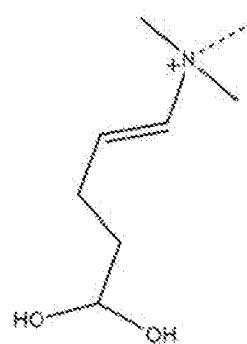
FIG. 4 is a structural of another ligand according to another embodiment of the present disclosure.
Figure 5:
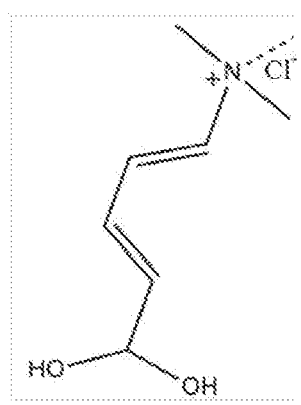
FIG. 5 is a structural of yet another ligand according to an embodiment of the present disclosure.

The cross-linkable group 11 is located at a site of the ligand 1 close to the coordination atom 10 (i.e. close to the end of the ligand 1 close to the zinc oxide nanoparticle 2)

and can be one (as shown in FIGS. 3 and 4) or more (as shown in FIG. 5) alkenyls or alkynyls.

Figure 2:
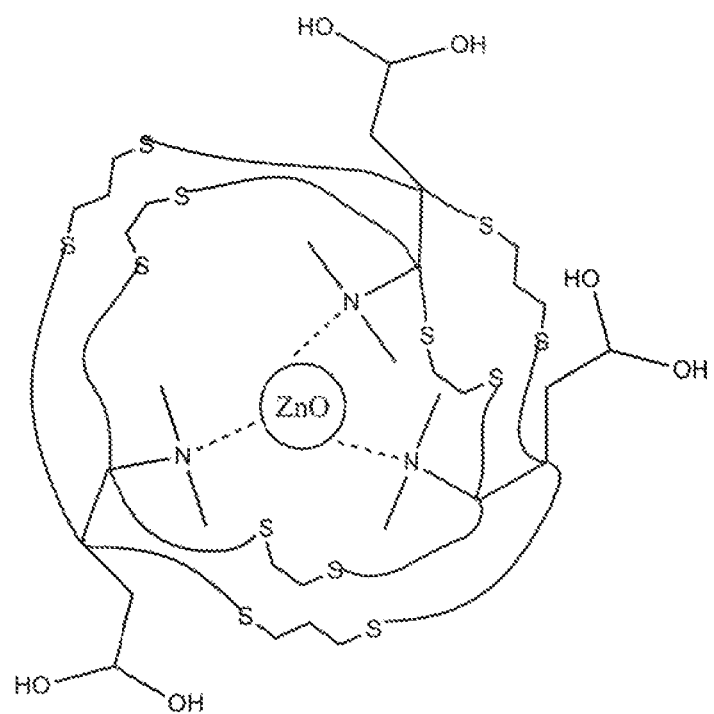
FIG. 2 is a schematic diagram showing a spider web-like structure of the zinc oxide nanoparticles after the self-crosslinking of the ligands according to an embodiment of the present disclosure.

Before the zinc oxide ink forming a layer, the cross-linkable groups 11 will occur a cross-linking reaction between the ligands 1 attached to a single zinc oxide nanoparticle 2 and form a spider web-like structure (as shown in FIG. 2). Several ligands 1 are adsorbed on the surface of the zinc oxide nanoparticles 2. In view of an absolute distance, as the distance between the cross-linkable groups 11 attached to the single zinc oxide nanoparticle 2 is much smaller than the distance between the cross-linkable groups 11 attached to different zinc oxide nanoparticles 2, the cross-linking between the cross-linkable groups 1 attached to the single zinc oxide nanoparticle 2 can be easily achieved, and the cross-linking between the cross-linkable groups 11 attached to different zinc oxide nanoparticles 2 is avoided, thereby being conducive to forming the spider web-like structure.

In the subsequent layer formation process of the zinc oxide ink, the volatilization of the volatile solvent is hindered by the spider web-like structure, thereby inhibiting the rapid volatilization of the volatile solvent, thus avoiding the a large number of pores in the layer which is formed by a large amount of bubbles resulted from the rapid volatilization of the volatile solvent, and thereby ensuring that a dense and trim layer having fewer defects can be formed by the zinc oxide ink.

Optionally, the ligand 1 in the embodiment has a branched functional group structure 12 at the tail end. The branched functional group structure 12 can be a group having a relatively large atomic volume, such as a hydroxyl, a carboxyl, an aldehyde group, an ester group, a carbonyl or halogen.

On one hand, the branched functional group structure 12 can increase the steric hindrance among the ligands 1 attached to different zinc oxide nanoparticles 2, and reduce and even eliminate the possibility of cross-linking between the ligands 1 attached to different zinc oxide nanoparticles 2. On the other hand, the branched functional group 12 can also promote the cross-linking between the ligands 1 attached to the same zinc oxide nanoparticle 2 in the zinc oxide ink, so that the possibility of cross-linking between the ligands 1 attached to the same zinc oxide nanoparticle 2 is much greater than the possibility of cross-linking of molecules of the ligands 1 attached to different zinc oxide nanoparticles 2, thereby being advantageous to forming the spider web-like structure (as shown in FIG. 2). In the process of layer formation, the spider web-like structure can inhibit the rapid volatilization of the volatile solvent so as to avoid the generation of a large number of pores in the formed layer, thereby ensuring that the dense and trim layer having less defects can be formed by the zinc oxide ink.

Optionally, in the embodiment, the coordination atoms 10 of the ligand 1 form an ion pair. The anion in the ion pair can be a halide ion, such as $Cl^-$, $Br^-$ or $I^-$. The zinc oxide ink is used for printing to form an electron transport layer in an organic electroluminescent device, and since the increase of the chain length of the ligand 1 may reduce the charge carrier transport performance of the electron transport layer, the ion pair of the coordination atom 10 can introduce charges into the long chain of the ligand 1 so as to guide the charge carrier transport, thereby avoiding the influence on the charge carrier transport performance of the electron transport layer.

Optionally, in the embodiment, the zinc oxide ink further comprises a cross-linking agent, and the cross-linking agent may comprise a dimercapto compound. Of course, the cross-linking agent is not limited to the dimercapto compound, and it can also be a cross-linking agent of other material. The cross-linking agent can promote the cross-linking of the cross-linkable groups 11 between the ligands 1 attached to the single zinc oxide nanoparticle 2 to form the spider web-like structure (as shown in FIG. 2). As a result, the rapid volatilization of the volatile solvent can be hindered in the layer formation process, thereby avoiding the formation of a large number of pores in the formed layer, and finally ensuring that a dense and trim layer having less defects can be formed by the zinc oxide ink.

Figure 6:
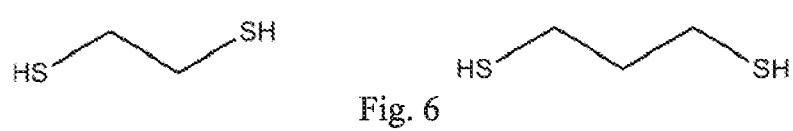
FIG. 6 is a structural of cross-linking agents with different chain lengths according to an embodiment of the present disclosure.

The zinc oxide ink may contain cross-linking agents with different chain lengths (as shown in FIG. 6), and the cross-linking between the ligands 1 attached to the same zinc oxide nanoparticle 2 is performed through a "click" reaction. There are different distances between the cross-linkable groups 11 when they are open, by virtue of the cross-linking agents with different chain lengths, the cross-linkable groups 11 with smaller distances could perform the "click" reaction with the cross-linking agent with a shorter chain length so as to form a cross-linking structure, and the cross-linkable groups 11 with greater distances could perform the "click" reaction with the cross-linking agent with longer chain length so as to form a cross-linking structure, and thereby forming the spider web-like structure (as shown in FIG. 2).

In the embodiment, the zinc oxide ink further comprises a volatile solvent and a non-volatile solvent, and the volume ratio of the volatile solvent and the non-volatile solvent is 10:1≤volatile solvent:non-volatile solvent≤1:10. The non-volatile solvent includes, but not limited to, ethylene glycol, diethylene glycol, dipropylene glycol and glycerol. The volatile solvent includes, but not limited to, methanol, ethanol, isopropanol and n-butanol.

Based on the above zinc oxide ink, the present disclosure further provides a preparation method of zinc oxide ink, including:

Step S01: preparing an ethanol solution of zinc oxide nanoparticles.

In this step, the ethanol solution of the zinc oxide nanoparticles is prepared according to a solution method, and the method is a conventional technique and will not be described here.

Step S02: adding a ligand compound into the ethanol solution of the zinc oxide nanoparticles, wherein the molar mass ratio of the ligand compound to the zinc oxide nanoparticles is smaller than 1:10, stirring the solution for 1-3 h and adding ethyl acetate therein to precipitate zinc oxide nanoparticles. The obtained zinc oxide nanoparticles are loaded with ligands derived from the ligand compound, and the ligand compound is selected from aliphatic compounds having a carbon chain of three or more carbon atoms; and the ligand compound has a cross-linkable group at a site close a coordination atom.

In this step, ethyl acetate may be added into the zinc oxide nanoparticle in ethanol solution after the solution is stirred for about 2 h.

Step S03: dissolving the zinc oxide nanoparticles in a mixed solvent made of a volatile solvent and a non-volatile solvent, and adding an initiator and a cross-linking agent therein to form the zinc oxide ink.

Based on the mass of the zinc oxide nanoparticles, the addition amount of a photoinitiator is less than 5% by mass. The addition amount of the cross-linking agent is from ⅓ to 2 times of mole number of the ligand compound.

In the zinc oxide ink provided in the present disclosure, the zinc oxide nanoparticles adopts the ligand having a chain length greater than two carbon atoms, compared with the zinc oxide nanoparticles in which the ligand is derived from ethanolamine (i.e. the chain length of the ligand is only tow carbon atoms) in the prior art, the steric hindrance among the zinc oxide nanoparticles is increased, thereby avoiding the aggregation among the zinc oxide nanoparticles, and accordingly, the formation of black points in the layer formed by the zinc oxide ink is avoided; and meanwhile, the ligands have self-crosslinking property and form a web-like structure by self-crosslinking to prevent the formation of a large number of pores of the layer due to the rapid volatilization of the solvent, and the quality of the layer formed by using the zinc oxide ink is ensured.

The present disclosure further provides an electron transport layer prepared by the zinc oxide ink.

The electron transport layer can be used as an electron transport layer in an organic electroluminescent device. The zinc oxide ink can be printed on a substrate by an ink jet printing method, the substrate loaded with zinc oxide ink is irradiated by ultraviolet light (with a wavelength of 365 nm) for about 3-8 minutes, and the substrate is heated with a vacuum degree of 300-500 mbar at 50-80° C. for about 0.5 h to prepare a dense zinc oxide thin layer.

Those skilled in the art can adjust the parameters of the above ink jet printing according to actual needs to obtain a zinc oxide layer.

By using the zinc oxide ink of the present disclosure, the dense and trim electron transport layer with fewer defects can be prepared, thereby improving the quality of the electron transport layer.

The present disclosure further provides a display device, including the above electron transport layer. The display device is an organic electroluminescent display device.

The display device provided by the present disclosure can be any product or component that has a display function, such as an OLED panel, a QLED panel, an OLED TV, a QLED TV, a display, a mobile phone, a navigator or the like. By using the electron transport layer of the present disclosure, the quality of the display device is improved.

EXAMPLES

Example 1

An ethanol solution of zinc oxide nanoparticles is prepared according to the process of preparing zinc oxide nanoparticles by a solution method. Ligand compound 1-alkenyl-4,4'-dihydroxybutylamine A (the derived ligand shown as in FIG. 3) are added into the ethanol solution, the pairing ions being chloride ions. After the solution is stirred for about 2 h, ethyl acetate is added into the solution to precipitate zinc oxide nanoparticles. The obtained zinc oxide nanoparticles are dissolved in a mixed solvent of diethylene glycol and isopropanol (diethylene glycol:isopropanol=2:3), and 1% photoinitiator and a cross-linking agent accounting for a half equivalent of the ligand compound are added into the mixed solution so as to form zinc oxide ink. The zinc oxide ink is printed on a substrate in an ink jet printing manner, and the substrate printed with the ink is irradiated with ultraviolet light for 5 min, and then the substrate is heated under a vacuum degree of 500 mbar at 50° C. for about 0.5 h to prepare a dense zinc oxide thin layer.

Example 2

An ethanol solution of zinc oxide nanoparticles is prepared according to the process of preparing zinc oxide nanoparticles by a solution method. Ligand compound 1,3-dienyl-5,5'-dihydroxypentylamine (the derived ligand shown as in FIG. 5) are added into the ethanol solution, the pairing ions being chloride ions. After the solution is stirred for about 2 h, ethyl acetate is added into the solution to precipitate zinc oxide nanoparticles. The zinc oxide nanoparticles are dissolved in a mixed solvent of 2,3-butanediol and n-butanol (2,3-butanediol:n-butanol=1:1), and 1% photoinitiator and a cross-linking agent accounting for a half equivalent of the ligand compound are added into the mixed solution so as to form zinc oxide ink. The zinc oxide ink is printed on a substrate in an ink jet printing manner, and the substrate printed with the ink is irradiated with ultraviolet light for 5 min, and then the substrate is heated under a vacuum degree of 300 mbar at 75° C. for about 0.5 h to prepare a dense zinc oxide thin layer.

Comparative Example

A zinc oxide thin layer is prepared in the same method as in the embodiment 1 except for using ethanolamine as the ligand compound.

The area proportions of the black points and pores (in 1 $cm^2$ thin layer) in the zinc oxide layers prepared in the embodiments 1-2 and the comparative example are measured. The area of the black points and pores in the zinc oxide layer in which the ethanolamine is used as the ligand is about 30%, and the areas of the black points and pores in the zinc oxide layers of Examples 1-2 are respectively about 12% and 10%. Therefore, the zinc oxide ink according to the present disclosure can significantly reduce the proportion of the black points and pores in the zinc oxide layer.

It can be understood that the above embodiments are merely exemplary embodiments employed for illustrating the principle of the present disclosure, but the present disclosure is not limited thereto. Those of ordinary skill in the art can make various variations and improvements without departing from the spirit and essence of the present disclosure, and these variations and improvements are also encompassed within the protection scope of the present disclosure.

The invention claimed is:

1. Zinc oxide ink, comprising zinc oxide nanoparticles loaded with ligands, wherein each ligand is derived from aliphatic compounds having a carbon chain of three or more carbon atoms; each ligand has a cross-linkable group at a carbon atom connected to a coordination atom and has a branched functional group structure at an end opposite to the coordination atom; a cross-linking structure is formed between the ligands by a dimercapto compound; and carbon atoms of the cross-linkable groups in adjacent ligands are connected through at least two "—S—" groups.

2. The zinc oxide ink according to claim 1, wherein the coordination atom of the ligand forms an ion pair structure.

3. The zinc oxide ink according to claim 1, wherein the ligand is derived from alcohol amine aliphatic compounds having three to eight carbon atoms.

4. The zinc oxide ink according to claim 1, wherein the cross-linkable group includes one or more alkenyls and alkynyls.

5. The zinc oxide ink according to claim 1, further comprising a volatile solvent and a non-volatile solvent.

6. An electron transport layer, wherein the electron transport layer is made by printing the zinc oxide ink according to claim 1.

7. A display device, comprising the electron transport layer according to claim 6.

* * * * *